(12) United States Patent
Hauser

(10) Patent No.: US 8,749,244 B2
(45) Date of Patent: Jun. 10, 2014

(54) CIRCUIT FOR MONITORING OF ACCUMULATOR CELLS CONNECTED IN SERIES

(75) Inventor: Clemens Hauser, Heilbronn (DE)

(73) Assignee: Atmel Automotive GmbH, Heilbronn (DE)

( * ) Notice: Subject to any disclaimer, the term of this patent is extended or adjusted under 35 U.S.C. 154(b) by 300 days.

(21) Appl. No.: 13/189,262

(22) Filed: Jul. 22, 2011

(65) Prior Publication Data

US 2012/0038364 A1    Feb. 16, 2012

Related U.S. Application Data

(60) Provisional application No. 61/374,086, filed on Aug. 16, 2010.

(30) Foreign Application Priority Data

Aug. 16, 2010 (DE) .......................... 10 2010 034 510

(51) Int. Cl.
*G01N 27/416* (2006.01)
*H02J 7/14* (2006.01)

(52) U.S. Cl.
USPC ............................ 324/426; 324/434; 320/116

(58) Field of Classification Search
USPC ................................................ 324/426, 434
See application file for complete search history.

(56) References Cited

U.S. PATENT DOCUMENTS

| | | | | |
|---|---|---|---|---|
| 7,791,371 | B2 * | 9/2010 | Nakazono | 326/68 |
| 8,269,305 | B2 * | 9/2012 | Yamaji | 257/501 |
| 8,330,469 | B2 * | 12/2012 | Miyamoto | 324/433 |
| 2001/0011881 | A1 * | 8/2001 | Emori et al. | 320/116 |
| 2010/0289497 | A1 * | 11/2010 | Lum-Shue-Chan et al. | 324/426 |
| 2010/0305770 | A1 * | 12/2010 | Bhowmik et al. | 700/295 |
| 2011/0074431 | A1 * | 3/2011 | Li | 324/426 |
| 2011/0187326 | A1 * | 8/2011 | Kawata et al. | 320/116 |
| 2011/0316078 | A1 * | 12/2011 | Kim et al. | 257/337 |

FOREIGN PATENT DOCUMENTS

| | | |
|---|---|---|
| DE | 25 29 364 | 7/1977 |
| DE | 10 2007 051 648 A1 | 4/2009 |
| DE | 10 2007 049 528 B4 | 6/2009 |
| DE | 102 97 334 B4 | 4/2010 |
| DE | 102010034510.5-35 | 8/2010 |

OTHER PUBLICATIONS

Office Action and English translation for German Patent Application 10 2010 034 510.5, Jun. 21, 2011.

* cited by examiner

*Primary Examiner* — Drew A Dunn
*Assistant Examiner* — David Henze-Gongola
(74) *Attorney, Agent, or Firm* — Baker Botts LLP

(57) ABSTRACT

In one embodiment, a circuit includes a measuring circuit coupled to an accumulator cell. A first output of the measuring circuit outputs a current signal based on a cell voltage of the accumulator cell. The circuit includes an interface circuit coupled to the first output of the measuring circuit and a second output of a level-shifter circuit configured to change a voltage level on the first output at the interface circuit. The level-shifter circuit includes a first input coupled to the first output and one or more transistors coupled in series with one or more gate terminals that are each coupled to each of one or more terminals of the accumulator cell.

20 Claims, 4 Drawing Sheets

CIRCUIT FOR MONITORING OF ACCUMULATOR CELLS CONNECTED IN SERIES

RELATED APPLICATIONS

This application claims the benefit, under 35 U.S.C. §119 (e), of U.S. Provisional Patent Application No. 61/374,086, filed 16 Aug. 2010. This application also claims the benefit, under 35 U.S.C. §119(a), of German Patent Application No. 102010034510.5-35, also filed 16 Aug. 2010.

TECHNICAL FIELD

This disclosure relates to circuits.

BACKGROUND

A battery pack or cell pack (such as for example a Li-Ion cell pack) may have multiple accumulator cells connected in series.

DESCRIPTION OF EXAMPLE EMBODIMENTS

Figure 1:
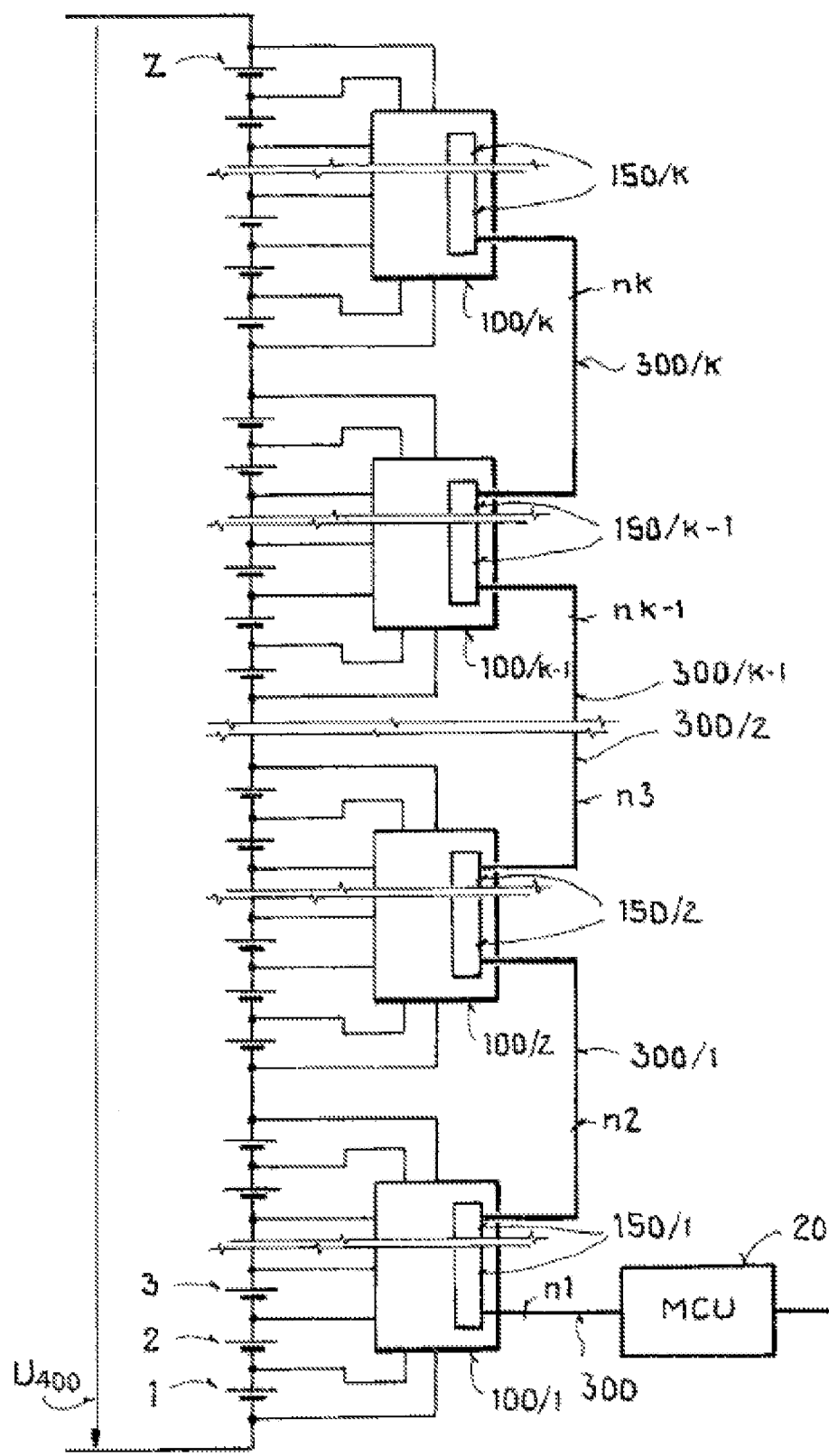
FIG. 1 is a schematic circuit diagram illustrating an example plurality of accumulator cells connected in series and example connected circuits for monitoring of the accumulator cells.

Particular embodiments provide a circuit, such as an IC for monitoring accumulator cells that are connected in series.

German Patent Application No. DE 102007049528 describes a method and a device for measuring the cell voltage of accumulator cells in a plurality of accumulator cells connected in series, such as a so-called battery pack or cell pack, such as the Li-Ion cell pack, which has a multiplicity of such accumulator cells connected in series.

Level-shifter circuits to supply a level-shifted output signal are known from German Patent Application No. DE 102007051648 and German Application No. DE 10297334. Current that flows from a low-voltage side to a high-voltage side is switched by means of a transistor.

Particular embodiments provide an improved, cost-effective, circuit for monitoring accumulator cells.

Particular embodiments provide a circuit for monitoring of accumulator cells that are connected in series.

In particular embodiments, the circuit has a measuring circuit, an interface circuit, and a level-shifter circuit. Depending on the number of the accumulator cells to be monitored, particular embodiments provide a plurality of measuring circuits and level-shifter circuits. In particular embodiments, the interface circuit may be set up for the communication with further external circuits. For this purpose, the interface circuit may be connected by means of a signal connection.

In particular embodiments, an accumulator cell may be connected to the measuring circuit. In particular embodiments, the measuring circuit is connected to a connection of the circuit. The connection of the circuit is interconnected with the terminal of at least one accumulator cell.

The measuring circuit may be designed to output a current signal on the output of the measuring circuit. In particular embodiments, the current signal may depend on a cell voltage of the accumulator cell that may be connected.

The level-shifter circuit is set up to adapt a voltage level on the output of the measuring circuit to the interface circuit. In particular embodiments, for this purpose, the level-shifter circuit through which the current signal flows causes a voltage drop across the level-shifter circuit. Levels on the output of the measuring circuit, which depend on the levels of the accumulator cell, may be shifted by the level-shifter circuit to levels that are compatible with the interface circuit.

An input of the level-shifter circuit may be connected with the output of the measuring circuit. In particular embodiments, the input of the level-shifter circuit is designed differentially. In particular embodiments, the input of the level-shifter circuit is connected to the output of the measuring circuit. An output of the level-shifter circuit may be connected with the interface circuit. In particular embodiments, the output of the level-shifter circuit is connected to the interface circuit.

The level-shifter circuit has a number of transistors connected in series with gate terminals. In particular embodiments, controlled paths of the transistors, in particular drain-source paths, are connected in series. The current signal causes a voltage drop across the controlled paths of the transistors in each case.

In particular embodiments, a different terminal of the accumulator cells connected in series may be connected to each of the gate terminals. In particular embodiments, because of the different terminals of the accumulator cells connected in series, each gate terminal of the transistors has a different level during normal operation. In particular embodiments, in order to interconnect all gate terminals of the transistors of the level-shifter circuit with the terminals of the accumulator cells to the extent possible, one connection of the circuit is connected exactly to one gate terminal of the transistors connected in series, in each case. Since in most cases each accumulator cell must be monitored anyway, no additional (housing) connections of the circuit are therefore required.

Using particular embodiments, such as illustrated in the figures, no transistors with a very high breakdown voltage are necessary. In particular embodiments, no transistors that have a breakdown voltage that is larger than the sum of the cell voltages of the connected accumulator cells are required. In particular embodiments, if 16 accumulator cells are monitored (connected), for example, then the sum of the cell voltages is up to 64V. In particular embodiments, merely transistors are required, the breakdown voltage of which (e.g. >10V), subject to appropriate minimum code distance, is larger than one cell voltage (e.g. 3V-4V). The transistors therefore require a correspondingly smaller chip surface so that the circuit may be produced more cost-effectively.

In particular embodiments, each transistor of a level-shifter circuit has a trough semiconductor region which is isolated from each trough semiconductor region of the other transistors. In particular embodiments, the trough semiconductor regions are isolated from each other by a nonconductor. Alternatively, the trough semiconductor regions may be isolated from each other by p-n junctions. By the electrical isolation of the transistors of the level-shifter circuit among one another, the voltages applied on the gate terminals may differ without a transistor being destroyed by too high of a voltage.

In particular embodiments, the measuring circuit has an analog-digital converter (ADC), such as a sigma-delta converter. In particular embodiments, the current signal on the output of the measuring circuit is a digital current signal. In particular embodiments, a first current value is advantageously assigned to a logical 'One' and a second current value to a logical 'Zero.' In particular embodiments, the digital current signal may be developed as a current pulse sequence, such as a bit stream.

In particular embodiments, the interface circuit has a detector circuit for the evaluation of the current signal. In particular embodiments, the detector circuit is set up for converting the current signals into logic signals for forwarding to further internal or external circuits, such as a microcontroller.

Particular embodiments provide that the transistors of the level-shifter circuit have a breakdown voltage that is smaller than the sum of the cell voltages of the accumulator cells that may be connected to the circuit. By this means, technologically simple and cost-effective transistors may be used.

In particular embodiments, the circuit has a further interface circuit and a further level-shifter circuit. In particular embodiments, the interface circuit and the further interface circuit are connected to each other by a further level-shifter circuit. In particular embodiments, the further level-shifter circuit has a further number of transistors connected in series with further gate terminals. In particular embodiments, the transistors are p-type metal-oxide-semiconductor (pMOS) or n-type MOS (nMOS) field-effect transistors (FETs). In particular embodiments, for example, on each of the further gate terminals of the transistors, a different terminal of the accumulator cells may be connected in turn. The interface circuit and the further interface circuit facilitate the communication between very different potentials, which are conditioned by the cell voltages of the connected accumulator cells. In particular embodiments, the interface circuit or the further interface circuit may be designed for connection of a serial data bus. Digital circuits may be connected with each other based upon the master-slave principle by means of a synchronous serial data bus. In particular embodiments, the serial data bus has the advantage that the number of data lines may be reduced significantly.

Particular embodiments are particularly advantageous both individually as well as in combination with each other.

FIG. 1 shows a schematic circuit diagram with accumulator cells 1 to Z that are connected in series. In particular embodiments, the accumulator cells 1 to Z are connected in series in order to generate a total voltage U400 of 400V, for example. Such type of interconnections of accumulator cells are used in hybrid vehicles or electrical road vehicles, for example, to supply electrical energy to electric motors. In particular embodiments, accumulator cells 1 to Z will be discharged. In particular embodiments, a charging current flows through the accumulator cells 1 to Z in order to charge the accumulator cells 1 to Z, which may be provided by a generator or from a mains connection.

In particular embodiments, to ensure safe operation of the accumulator cells 1 to Z, it is necessary that each cell voltage of each accumulator cell 1 to Z is monitored separately to the extent possible. In particular embodiments, by monitoring, it is possible to interrupt the charging current or to prevent that an accumulator cell 1 to Z is totally discharged. In FIG. 1, one part of the accumulator cells 1 to Z is respectively interconnected with a circuit 100/1, 100/2, 100/$k$−1 and 100/$k$. In particular embodiments, each circuit 100/1, 100/2, 100/$k$−1 and 100/$k$ is developed as an IC 100/1, 100/2, 100/$k$−1, 100/$k$ on a (separate) semiconductor chip.

In particular embodiments, the transistors of the respective IC 100/1, 100/2, 100/$k$−1, 100/$k$ may be configured for a limited voltage range, depending on the technology used, which is smaller than the total voltage U400 of the accumulator cells 1 to Z. In particular embodiments, to monitor all accumulator cells 1 to Z to the extent possible, several ICs 100/1, 100/2, 100/$k$−1, 100/$k$ are provided which may be respectively connected to several adjacent accumulator cells. The ICs 100/1, 100/2, 100/$k$−1, 100/$k$ are interconnected with each other by a signal connection 300/1, 300/2, 300/$k$−1, 300/$k$ and moreover with a data processor 200 via a further signal connection 300. In particular embodiments, the data processor 200 may be a microcontroller (MCU). The bit width n1, n2, n$k$−1, n$k$ of the signal connections 300/1, 300/2, 300/$k$−1, 300/$k$ may be different, corresponding to the required signal lines. Alternatively, a data bus may also be used as a signal connection 300/1, 300/2, 300/$k$−1, 300/$k$. If the signal connections 300/1, 300/2, 300/$k$−1, 300/$k$ are developed bidirectionally, the data processor 200 may control the monitoring of the accumulator cells 1 to Z and the actual cell voltage of the accumulator cells 1 to Z may be evaluated.

In particular embodiments, each IC 100/1, 100/2, 100/$k$−1, 100/$k$ together with at least one further IC 100/1, 100/2, 100/$k$−1, 100/$k$ may have a common connection to an accumulator cell and thus a common level as reference potential for the signal transmission. In particular embodiments, each IC 100/1, 100/2, 100/$k$−1, 100/$k$ has a level-shifter circuit 150/1, 150/2, 150/$k$−1, 150/$k$ that facilitates a signal transmission within the IC 100/1, 100/2, 100/$k$−1, 100/$k$ between different levels, the level difference of which exceeds the permissible analog or in particular digital (logic) levels of the connected (logic) transistors.

Figure 2:
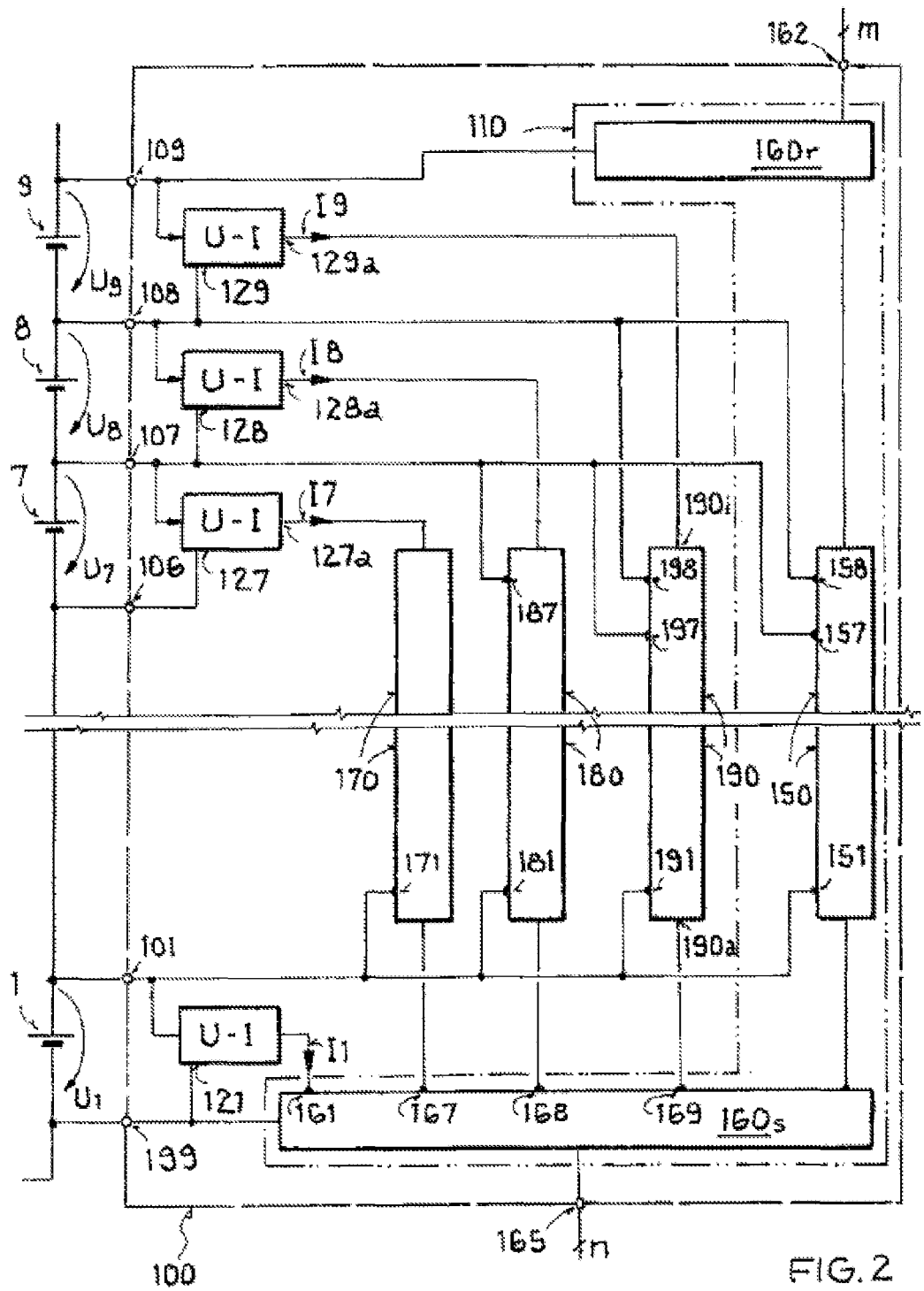
FIG. 2 is a second schematic circuit diagram of an example circuit for monitoring.

FIG. 2 is an IC 100 for monitoring of accumulator cells 1, 7, 8, 9, as a schematic representation. The IC 100 has several connections 101, 106, 107, 108, 109, 199, onto which accumulator cells 1, 7, 8, 9 may be connected. In particular embodiments, each accumulator cell 1, 7, 8, 9 has a cell voltage U1, U7, U8 or U9. To simplify understanding the functionality of the circuit, FIG. 2 only represents a part of the accumulator cells 1, 7, 8, 9 and the associated circuit 100, as indicated by the break. Particular embodiments, in order to measure the cell voltages U1, U7, U8, U9 of the accumulator cells 1, 7, 8, 9, measuring circuits 121, 127, 128, and 129 are connected with the connections 101, 106, 107, 108, 109, and 199.

In particular embodiments, the measuring circuits 121, 127, 128, and 129 are configured to measure the respective voltage applied on the respective connection pair 199 and 101, 106 and 107, 107 and 108, as well as 108 and 109, and to output a current signal I1, I7, I8, I9 that is associated with this applied voltage. In particular embodiments, an analog current that is proportional to the applied voltage is output as an analog current signal I1, I7, I8, I9. In particular embodiments, the voltage applied on the respective connection is converted into a digital signal as a current signal I1, I7, I8, I9, such as a corresponding current pulse sequence.

In particular embodiments, the circuit 100 has interface circuits 160*s* and 160*r* that facilitate communication with further ICs. In particular embodiments, the interface circuits 160*s* and 160*r* form an interface to an n-bit wide or m-bit wide bus system or the like. In particular embodiments, the measuring circuit 121 here is connected directly to the interface circuit 160*s*, since the current signal I1 is already output with the required level for the interface circuit 160*s*. In FIG. 2, the circuit is connected via the connection 199 with a terminal on the accumulator cell 1, where the potential on this accumulator cell 1 serves as a reference potential, such as a frame potential.

In particular embodiments, the measuring circuits 127, 128, 129 are respectively connected via a level-shifter circuit 170, 180, 190 with the interface circuit 160s. The current signal 19 has voltage levels that are shifted to lower levels by the connected level-shifter circuit 190. The lower levels, for example, are compatible with analog levels or logic levels for the following interface circuit 160s or an evaluation circuit (not shown). One input 190i of the level-shifter circuit 190 is connected to the output 129a of the measuring circuit 129. One output 190a of the level-shifter circuit 190 is connected to the interface circuit 160s. Accordingly, one output 128a of the measuring circuit 128 is connected via the level-shifter circuit 180 with the interface circuit 160s. Accordingly, one output 127a of the measuring circuit 127 is connected via the level-shifter circuit 170 with the interface circuit 160s. In particular embodiments, because of the different voltage levels of the current signals 19, 18 and 17, the level-shifter circuits 190, 180, and 170 may be designed differently, in that they may have a different number of transistors.

In particular embodiments, inputs 191, 197, 198 of the level-shifter circuit 190 are connected to connections 101, 107 and 108 of the circuit 100. Accordingly, the cell voltages U1, U7, U8 of the connectable accumulator cells 1, 7, 8 are also present on the inputs 191, 197, 198 of the level-shifter circuit 190. In this context, the cell voltages U1, U7, U8 form intermediate levels between the output level of the measuring circuit 129 and the logic level of the interface circuit 160s. In particular embodiments, the intermediate levels may be used for shifting the output level of the measuring circuit 129. The level-shifter circuit 190 is therefore configured to shift a level of the current signal 19 applied on one input 190i by means of the cell voltages U1, U7, U8 and applied on the further inputs 191, 197, 198 to an acceptable level of the connected interface circuit 160s.

A further level-shifter circuit 150 is illustrated in FIG. 2, which is connected between the first interface circuit 160s and the second interface circuit 160r. In particular embodiments, the further level-shifter circuit 150, the interface circuit 160s, and the second interface circuit 160r, form an interface 110 for connection with external circuits, which may be connected via connections 162, 165 with the circuit 100.

In particular embodiments, by means of the further level-shifter circuit 150, current signals between the first interface circuit 160s and the second interface circuit 160r may be transmitted. The first interface circuit 160s and the second interface circuit 160r work with different levels in this context, which are conditional because of the cell voltages of the connected accumulator cells 1, 7, 8, 9, that are connected in series. In particular embodiments, the further level-shifter circuit 150 is also configured to shift an applied level of the first interface circuit 160s by means of the cell voltages U1, U7, U8, applied on the inputs 151, 157, 158, to a permissible level of the connected second interface circuit 160r.

Figure 3:
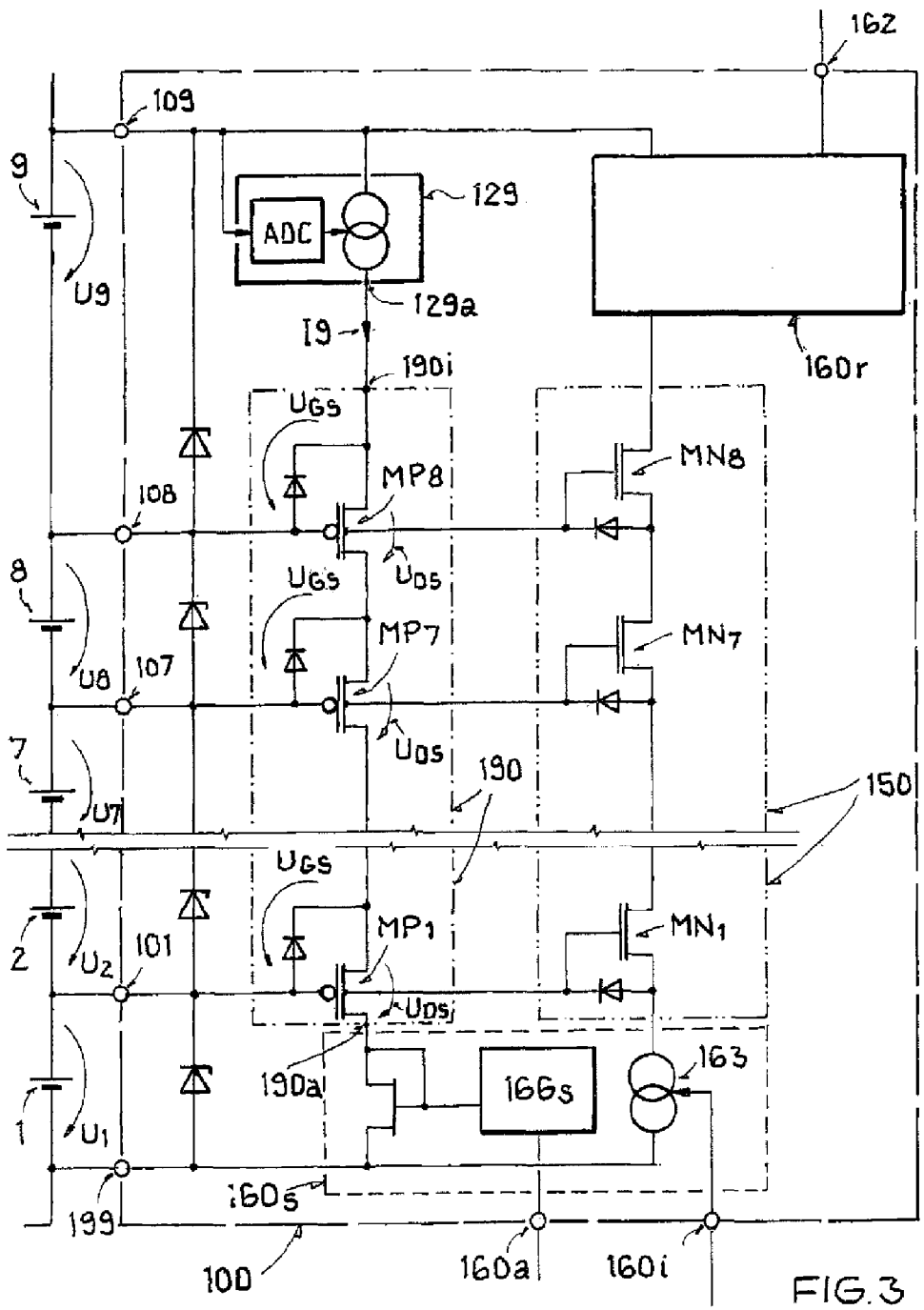
FIG. 3 is a schematic subcircuit diagram illustrating an example level-shifter circuit.

A part of the circuit 100 is represented as a schematic diagram in FIG. 3. In particular embodiments, a measuring circuit 129 that is connected with accumulator cell 9 has an ADC, which produces a digital current signal 19 on output 129a of the measuring circuit 129. In particular embodiments, an input 190i of a level-shifter circuit 190 may be connected on output 129a of the measuring circuit 129, into which the current signal 19 flows. The level-shifter circuit 190 of the embodiment in FIG. 3 has a number of FETs of which merely three FETs MP1, MP7, MP8 are represented for the purpose of providing a clearer overview. In FIG. 3, the level-shifter circuit 190 has pMOSFETs MP1, MP7, MP8. In particular embodiments, nMOSFETs or bipolar transistors may also be used. The transistors MP1, MP7, MP8 of the level-shifter circuit 190 are connected in series. In FIG. 3, the drain-to-source paths of the FETs MP1, MP7, MP8 are connected in series.

In particular embodiments, with each FET MP1, MP7, MP8, the drain-to-source voltage $U_{DS}$ decays across the drain-source path. The voltage decay across the level-shifter circuit 190 consequently spreads over several drain-to-source voltages $U_{DS}$ of the FETs MP1, MP7, MP8. The gate connections of the FETs MP1, MP7, MP8 are connected to the connections 101, 107, 108 of the circuit 100, so that voltages are present on the gate connections of the FETs MP1, MP7, MP8, which are dependent on the accumulator cells 1, 7, 8, and so on. Accordingly, two of the gate connections of the FETs MP1, MP7, MP8 may be connected to each other through the terminal of the accumulator cells 1, 7, 8, via accumulator cells 1, 7, 8. In particular embodiments, electrostatic discharge (ESD) fuse links may be provided for safeguarding the connections 101, 107, 108, 109, 199, of circuit 100.

In FIG. 3, the source level on the respective FET MP1, MP7, MP8 may differ from the gate level by the gate-to-source voltage $U_{GS}$. In particular embodiments, the source level may also be dependent upon the respective cell voltage of the connected accumulator cell and only differs by the gate-to-source voltage $U_{GS}$ of the connected transistor. The drain-to-source voltage $U_{DS}$ is applied across the gate-to-source path of the transistor, which essentially corresponds to the cell voltage $U_1$ of the connected accumulator cell 1.

In particular embodiments, by using several transistors MP1, MP7, MP8 of the level-shifter circuit 190 in the represented interconnection, this achieves the effect that the output level on the output of the level-shifter circuit 190 changes only insignificantly depending on a change of the cell voltage U1 of the first accumulator cell 1, so that a large change in the sum of the cell voltages U1 to U9 does not cause any significant level changes on the output of the level-shifter circuit 190.

The interface circuit 160s in FIG. 3 has a detector circuit 166s by means of which the current signal 19 may be evaluated. In particular embodiments, a signal that depends on the current signal 19 may be output via the connection 160a. The interface circuit 160s of FIG. 3 furthermore has a controllable current source 163, the control input of which is connected with a connection 160i of the circuit 100.

In particular embodiments, a further level-shifter circuit 150 is provided to transmit signals from the interface circuit 160s to a further interface circuit 160r. The further level-shifter circuit 150 has a number of nMOS transistors MN1, MN7, MN8, the gate connections of which may also be connected via the connections 101, 107, 108 of the circuit 100 to the accumulator cells 1, 2, 7, 8. In particular embodiments, the further interface circuit 160r is connected to the connection 109 to provide a reference level on its output 162. The further interface circuit 160r in particular has a current switch for activation or deactivation of output 162 or an ESD protective circuit or a current limitation to limit the output current.

In particular embodiments, for the parallel transmission of further bits, a correspondingly higher number of parallel level-shifter circuits is required.

Figure 4:
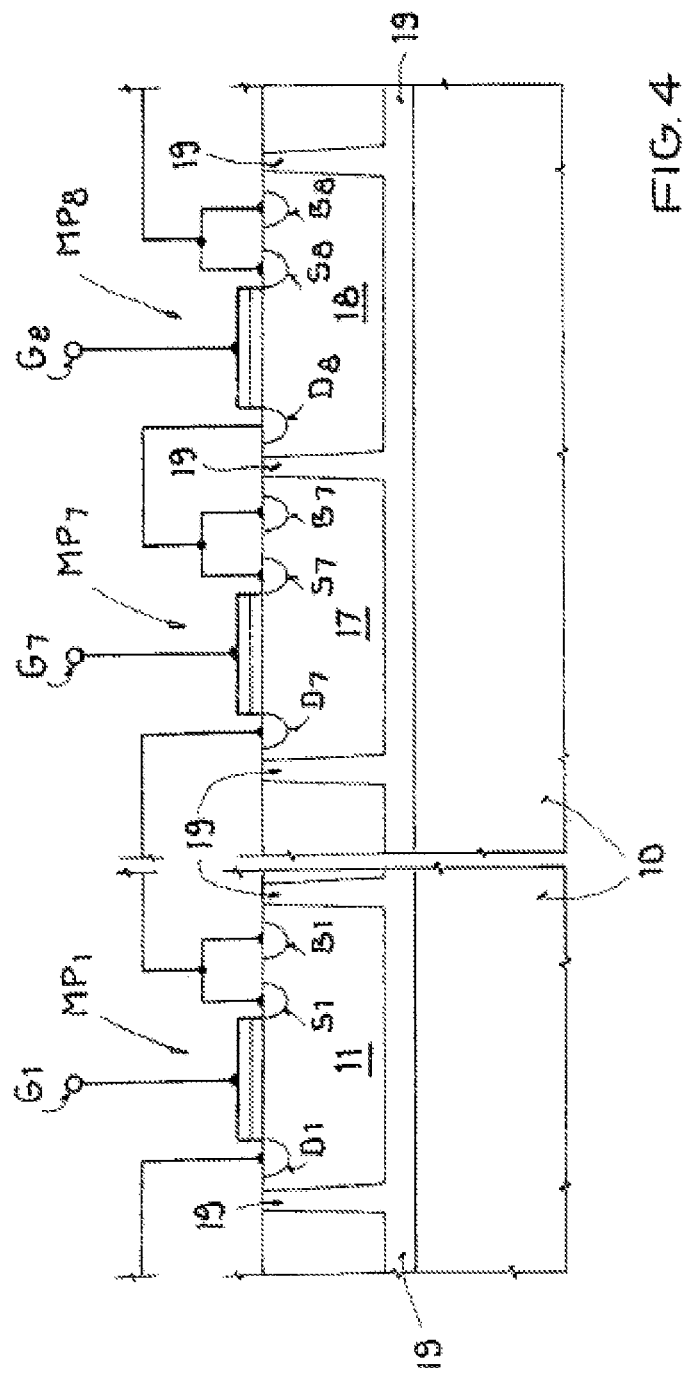
FIG. 4 is a schematic cross-sectional view illustrating example transistors of a level-shifter circuit.

FIG. 4 is a schematic cross-sectional view through a part of a level-shifter circuit. In particular embodiments, the substrate 10 may be separated from the semiconductor regions 11, 17, 18, by the dielectric region 19. The semiconductor regions 11, 17, 18, may also be electrically isolated from each other by the non-conductor 19. Transistors MP1, MP7, and MP8 are components of the level-shifter circuit 190 as illustrated in FIG. 3. In FIG. 4, transistors MP1, MP7 and MP8 are pMOSFETs, but alternatively, nMOSFETs or bipolar transistors may also be used. Transistors MP1, MP7, MP8, are respectively present in one of the semiconductor regions 11, 17, 18, which are isolated from each other by the nonconductor 19. In particular embodiments, p-n junctions may be developed to isolate the semiconductor regions 11, 17, 18, from each other (not shown in FIG. 4).

In FIG. 4, each transistor MP1, MP7, and MP8 of the level-shifter circuit 190 has a trough semiconductor region 11, 17, 18, which is isolated from the trough semiconductor regions 11, 17, or 18 of the other transistors MP1, MP7, or MP8. In FIG. 4, each transistor has a p+ doped drain region D1, D7, D8, a p+ doped source region S1, S7, S8, an n+ doped trough connection region B1, B7, B8, a trough semiconductor region 11, 17, 18, and a gate electrode G1, G7, G8. In particular embodiments, the transistors MP1, MP7, MP8 may be connected in series. Each p+ doped source region S1, S7, S8 is short-circuited with the n+ doped trough connection region B1, B7, B8 of the same transistor MP1, MP7, or MP8.

This disclosure is not limited to the example embodiments illustrated in FIGS. 1 to 4. In particular embodiments, other types of transistors may be used. Circuits for monitoring of 8 or 16 or another number of accumulator cells are also possible. The functionality of the circuit according to FIG. 2 may in particular be used advantageously for accumulator cells of a hybrid vehicle or electric vehicle.

The following is a list of reference symbols and numbers in FIGS. 1 to 4, provided for example illustration purposes only and not by way of limitation:
   1 . . . Z, 2, 3, 7, 8, 9 Accumulator cell
   10 Substrate
   11, 17, 18, 19 Trough semiconductor region
   19 Nonconductor
   100, 100/1, 100/2, 100/k−, 100/k Circuit
   101, 106, 107, 108, 109, 160a, Connection
   160i, 165, 162, 199
   121, 127, 128, 129 Measuring circuit
   121a, 127a, 128a, 129a, 190a Output
   150, 150/1, 150/2, 150/k−1, 150/k, Level-shifter circuit
   170, 180, 190
   151, 157, 158, 161, 167, 168, Input
   169, 171, 181, 187, 190i, 191,
   197, 198
   160s, 160r Interface circuit
   163 Controlled current source
   166s, 166r Detector circuit
   200 Data processor, microcontroller
   300/1, 300/2, 300/k−1, 300/k Signal bus, data bus
   MP1, MP7, MP8 pMOS field-effect transistor
   MN1, MN7, MN8 nMOS field-effect transistor Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A circuit comprising:
a measuring circuit coupled to an accumulator cell, a first output of the measuring circuit outputting a current signal based on a cell voltage of the accumulator cell;
an interface circuit coupled to:
the first output of the measuring circuit; and
a second output of a level-shifter circuit configured to change a voltage level on the first output at the interface circuit; and
the level-shifter circuit, comprising:
a first input coupled to the first output; and
one or more transistors coupled in series with one or more gate terminals that are each directly coupled to each of one or more terminals of the accumulator cell.

2. The circuit of claim 1, wherein each of the transistors of the level-shifter circuit has a trough semiconductor region that is isolated from each of the other trough semiconductor regions of the level-shifter circuit.

3. The circuit of claim 1, wherein:
the measuring circuit comprises an analog/digital converter (ADC); and
the current signal is a digital current signal.

4. The circuit of claim 1, wherein:
the measuring circuit comprises an analog voltage-to-current converter; and
the current signal is an analog current signal.

5. The circuit of claim 1, wherein the interface circuit comprises a detection circuit for evaluating the current signal.

6. The circuit of claim 1, wherein:
the accumulator cell is coupled in series to one or more other accumulator cells; and
a break-down voltage of one or more of the transistors of the level-shifter circuit is smaller than a sum of cell voltages of the accumulator cell and the other accumulator cells.

7. The circuit of claim 1, further comprising another interface circuit coupled to the interface circuit through another level-shifter circuit, the other level-shifter circuit comprising one or more other transistors coupled in series with one or more other gate terminals, each of the one or more other gate terminals coupled to the one or more terminals of the accumulator cell.

8. The circuit of claim 7, wherein the interface circuit and the other interface circuit are coupled to a data bus.

9. A method comprising:
generating a current signal based on a voltage of an accumulator cell;
determining whether a voltage of the current signal is compatible with an interface circuit that is configured to generate a logic signal based on the current signal for communication on a data bus to a controller;
if the voltage of the current signal is compatible with the interface circuit, then communicating the current signal to the interface circuit without changing the voltage of the current signal;
if the current signal is not compatible with the interface circuit, then changing, by one or more transistors coupled in series with one or more gate terminals that are each coupled to each of one or more terminals of the accumulator cell, the voltage of the current signal to be compatible with the interface circuit and then communicating the current signal to the interface circuit;

generating based on the current signal the logic signal for communication on the data bus to the controller.

10. The method of claim 9, further comprising evaluating the current signal at a detector circuit of the interface circuit, the detector circuit:

converting the current signal to a logic signal; and outputting the logic signal to an external circuit.

11. The method of claim 9, wherein adapting the current signal to be compatible with the interface circuit comprising dropping the voltage of the current signal across controlled paths of one or more transistors of the level-shifter circuit.

12. The method of claim 11, wherein the one or more transistors of the level-shifter circuit are field-effect transistors each having a trough semiconductor region that is isolated from other trough semiconductor regions of the level-shifter circuit.

13. The method of claim 9, wherein:

the converter of the measuring circuit is an analog/digital converter (ADC); and the current signal is a digital current signal.

14. The method of claim 9, wherein:

the converter of the measuring circuit comprises an analog voltage-to-current converter; and the current signal is an analog current signal.

15. A system comprising:

a battery having an accumulator cell;

a measuring circuit coupled to the accumulator cell, a first output of the measuring circuit outputting a current signal based on a cell voltage of the accumulator cell;

an interface circuit coupled to:

the first output of the measuring circuit; and a second output of a level-shifter circuit configured to change a voltage level on the first output at the interface circuit; and the level-shifter circuit, comprising:

a first input coupled to the first output; and one or more transistors coupled in series with one or more gate terminals that are each directly coupled to each of one or more terminals of the accumulator cell; and a controller configured to receive a logic signal based on the current signal from a data bus coupled to the interface circuit.

16. The system of claim 15, wherein each of the transistors of the level-shifter circuit has a trough semiconductor region that is isolated from each of the other trough semiconductor regions of the level-shifter circuit.

17. The system of claim 15, wherein:

the measuring circuit comprises an analog/digital converter (ADC); and the current signal is a digital current signal.

18. The system of claim 15, wherein:

the measuring circuit comprises an analog voltage-to-current converter; and the current signal is an analog current signal.

19. The system of claim 15, further comprising another interface circuit coupled to the interface circuit through another level-shifter circuit, the other level-shifter circuit comprising one or more other transistors coupled in series with one or more other gate terminals, each of the other gate terminals coupled to the terminals of the accumulator cell.

20. The system of claim 19, wherein the other interface circuit is coupled to the data bus.

\* \* \* \* \*